United States Patent [19]

Staiger

[11] Patent Number: 5,630,109
[45] Date of Patent: May 13, 1997

[54] APPARATUS FOR PROCESSING OF A SERIES OF TIMING SIGNALS

[75] Inventor: Dieter E. Staiger, Weil Im Schoenbuch, Germany

[73] Assignee: International Business Machines Corporation, Armonk, N.Y.

[21] Appl. No.: 487,371

[22] Filed: Jun. 7, 1995

[30] Foreign Application Priority Data

Jun. 4, 1994 [EP] European Pat. Off. .............. 94108675

[51] Int. Cl.⁶ ...................................................... G06F 1/04
[52] U.S. Cl. ........................................................ 395/556
[58] Field of Search .............................. 395/550; 327/31, 327/35, 36, 113, 114, 298

[56] References Cited

U.S. PATENT DOCUMENTS

| | | |
|---|---|---|
| 4,608,706 | 8/1986 | Chang et al. . |
| 4,748,644 | 5/1988 | Silver et al. . |
| 4,849,702 | 7/1989 | West et al. . |
| 5,311,486 | 5/1994 | Alton et al. . |
| 5,321,700 | 6/1994 | Brown et al. . |
| 5,440,721 | 8/1995 | Morgan et al. ........................ 395/550 |

FOREIGN PATENT DOCUMENTS 0343537  5/1989  European Pat. Off. ........ G06F 11/26

OTHER PUBLICATIONS

Review of Scientific Instruments, vol. 48, No. 6, Jun. 1977, New York US pp. 656–660 Conway et al, 'Circuit for a Digital Pulse Progammer' p. 657, col. 2, Paragraph 1–Paragraph 2.

Primary Examiner—Thomas M. Heckler
Attorney, Agent, or Firm—James M. Leas

[57] ABSTRACT

A frequency and timing generator is presented with high accuracy and frequency resolution and no switching time between different timing cycles for a wide applicable frequency range, wherein the repetition rate of the timing cycles is not limited by the processing speed of the components. The frequency and timing generator according to the invention is accomplished by an apparatus for parallel processing of a series of timing signals comprising at least one processing unit for processing and calculating time values from timing parameters representing the series of timing signals, an output unit for outputting the series of timing signals, and an input unit for inputting the timing parameters. The sequences of n successive timing parameters to be parallelly processed are distributable by the input unit to n processing units. A first time value from a first one of the timing parameters is calculatable by a first one of the processing units, and a succesive time value is calculatable by a succesive one of the processing units from the corresponding successive timing parameter of the sequence and the calculated time value of the respective preceding timing parameter.

18 Claims, 11 Drawing Sheets

APPARATUS FOR PROCESSING OF A SERIES OF TIMING SIGNALS

FIELD OF THE INVENTION

The invention relates to an apparatus for the processing of a series of timing signals comprising at least one processing unit for processing and calculating time values from timing parameters representing the series of timing signals and an output unit for outputting the series of timing signals.

BACKGROUND OF THE INVENTION

Timing signals are widely used in timing and frequency generators and especially for test equipments. The increasing demand and capacity of memory chips and ASICs requires fast and accurate testing equipments. Frequency generators with a wide range of frequencies are generally known in the prior art as phase locked loop (PLL) circuits or programmable pre-scalers. The former perform with a high frequency resolution, whereas the latter exhibit higher accuracy and no switching time between different frequency applications.

U.S. Pat. No. 4,263,669 by the present inventor discloses a frequency synthesizer which combines the advantages of phase locked loop (PLL) circuits and programmable prescalers in having a wide frequency range with high accuracy and resolution and no switching time between different frequencies. The generation of a pulse cycle is derived from a specific count of a down counter loadable with a start count when the counting process has reached the zero count. For affecting a higher time resolution of the pulse cycles, the beginning of a count down process is delayed by integer multiples of the count clock. Although the frequency synthesizer is capable of generating even single cycles with a frequency resolution in pico-seconds range, the repetition rate of those cycles is limited by the processing speed of the components.

SUMMARY OF THE INVENTION

It is therefore an object of the invention to provide a frequency and timing generator wherein the repetition rate of the timing cycles is not limited by the processing speed of the components.

It is another object of the invention to provide a frequency and timing generator with high accuracy and frequency resolution and no switching time between different timing cycles for a wide applicable frequency range.

It is yet another object to provide circuits comprising modular structure in order to optimize the cost of components and the load on the machines.

It is yet another object to provide circuits separable into circuits requiring high or low accuracy components.

It is yet another object to provide a frequency and timing generator with high accuracy and frequency resolution with mainly low cost components in parallel processing technology.

The objects of the invention are solved by an input unit for inputting the timing parameters, whereby sequences of n successive timing parameters to be parallelly processed are distributable by the input unit to n processing units. A first time value from a first one of the timing parameters is calculatable by a first one of the processing units, and a succesive time value is calculatable by a succesive one of the processing units from the corresponding successive timing parameter of the sequence and the calculated time value of the respective preceding timing parameter.

In a further embodiment the output unit comprises storage means coupled to each processing unit for storing the calculated time values of each processing unit, and timing generators coupled to the storage means for generating timing signals from the stored time values, each timing generator is triggerable by the timing generator generating the preceding timing signal or by a trigger signal simultaneously applied to each timing generator. The storage means allow a decoupling between the processing of the output unit and the processing units. The possibilty of triggering allows an easy control of the timing generation.

In another embodiment the output unit is clockable by an oscillator timing signal. This allows a reference of the timing signals generation to a precise reference oscillator signal, thus decoupling the timing generation from tolerances in the timing processing.

In another embodiment each processing unit comprises a calculation unit for calculating the time values and register means coupled to the calculation unit for registering each timing parameter unless the calculated time value of the preceding timing parameter is available. This allows the setting of a defined time for the calculation in order to prevent malfunctions due to time delays in the calculation units. Furthermore, all timing parameters of one sequence are simultaneously applicable to the processing units, for example with each new CLOCK signal.

Another embodiment further comprises a separation means for separating the timing parameters into fine parameters and coarse parameters, whereby the coarse parameters represent times greater or equal than the oscillator period time and the fine parameter represent times smaller than the oscillator period time. The separation allows the use of highly accurate timing generators which only need to cover the timing generation of a timing range less than or equal to the oscillator period time.

Another embodiment further comprises a pilot calculator for providing the last time value of one sequence to the first calculation unit to calculate a next time value from the last time value of one sequence and the successive timing parameter, the pilot calculator being coupled to the first one of the processing unit calculating the first time value of each sequence. The usage of a pilot calculator allows the separate calculation of each sequence of timing parameters independent the results of the calculation of the preceding sequence, thus increasing the processing speed.

In another embodiment the pilot calculator is built up according to the processing units, thus reducing the number of different modules or components needed.

The modular structure of the processing units according to an embodiment of the invention is especially advantageous for applications using low cost components, such as PLAs (Programmable Logic Array) and FPGAs (Field Programmable Gate Array), and easily enables combining multiple units with a high performance.

The objects of the invention are also solved by a method comprising: a first step of inputting timing parameters representing the series of timing signals, a second step of distributing sequences of n successive timing parameters to be parallelly processed to n processing units, a third step of calculating time values from the timing parameters, and a fourth step of outputting the series of timing signals. In the third step, a first one of the processing units calculates a first time value from a first one of the first timing parameters, and a succesive one of the processing units calculates a succesive time value from the corresponding successive timing parameter of the one sequence and the calculated time value of the respective preceding timing parameter.

DESCRIPTION OF THE DRAWINGS

FIG. 4b shows an example of the calculation process according to an embodiment of FIG. 4a.

FIG. 5 shows a further improved output unit 30 according to the embodiment of FIG. 4a.

DETAILED DESCRIPTION OF THE INVENTION

Figure 1A:
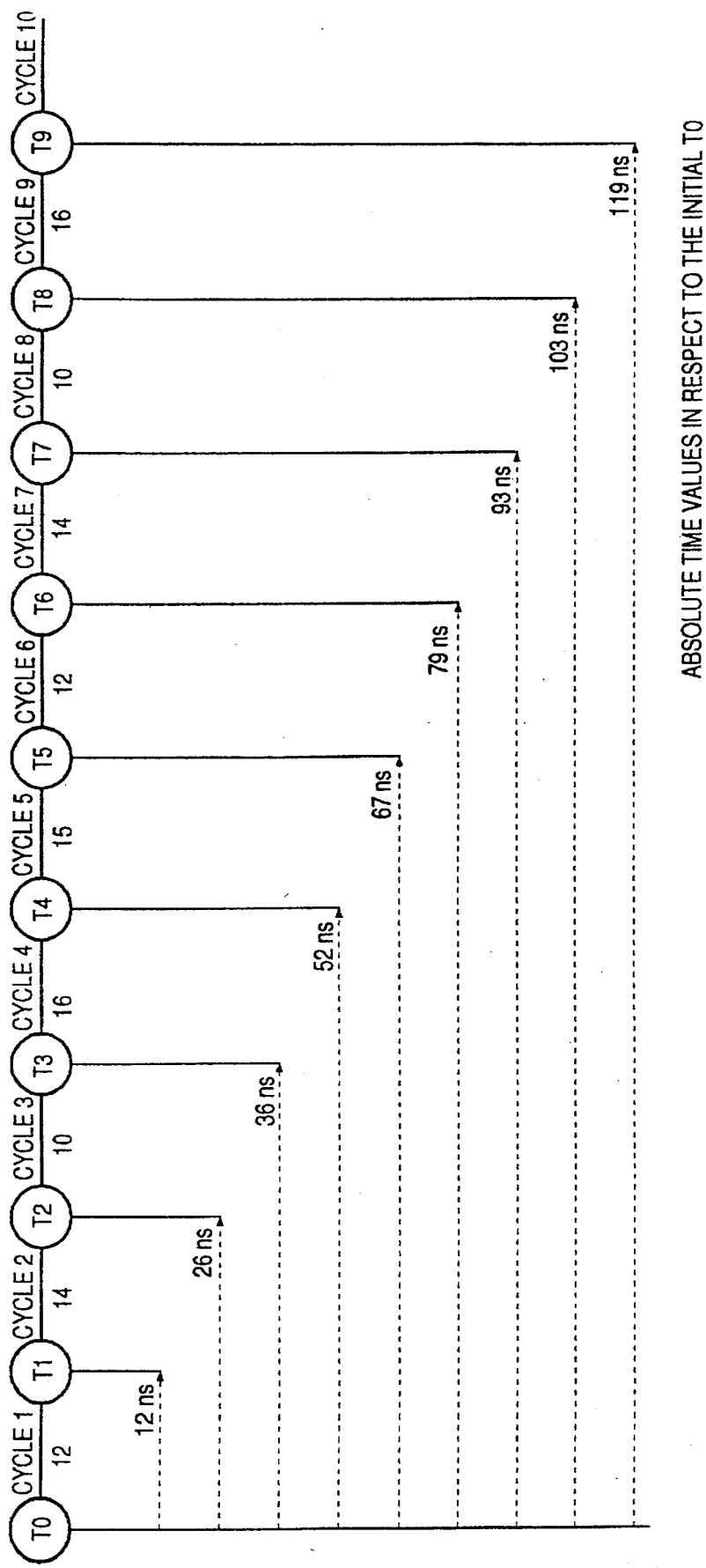
FIG. 1a illustrates an example of the invention.

FIG. 1a illustrates an example of the invention. A series of timing signals is to be output serially with predetermined time intervals. The time intervals between successive timing signals are represented by timing parameters which in the example are: 12 ns between timing signal T0 and T1, 14 ns between timing signal T1 and T2, 10 ns between timing signal T2 and T3, 16 ns between timing signal T3 and T4, and so forth. That means that the first timing signal T1 is to appear 12 ns after the initial timing signal T0. The second timing signal T2 will be applied 14 ns after the first timing signal T1 and 26 ns after the initial timing signal T0. The third timing signal T3 will be applied 10 ns after the second timing signal T2 and 36 ns after the initial timing signal T0 and so on. The time interval between a timing signal and the initial timing signal is called the time value of the respective timing parameter and has to be determined. It is to be understood that the values and the units are only exempary. Also, the timing parameter does not necessarily need to refer to the time intervals between succcessive timing signals and the time values can also be derived from the timing parameters by another calculation method.

Figure 1B:
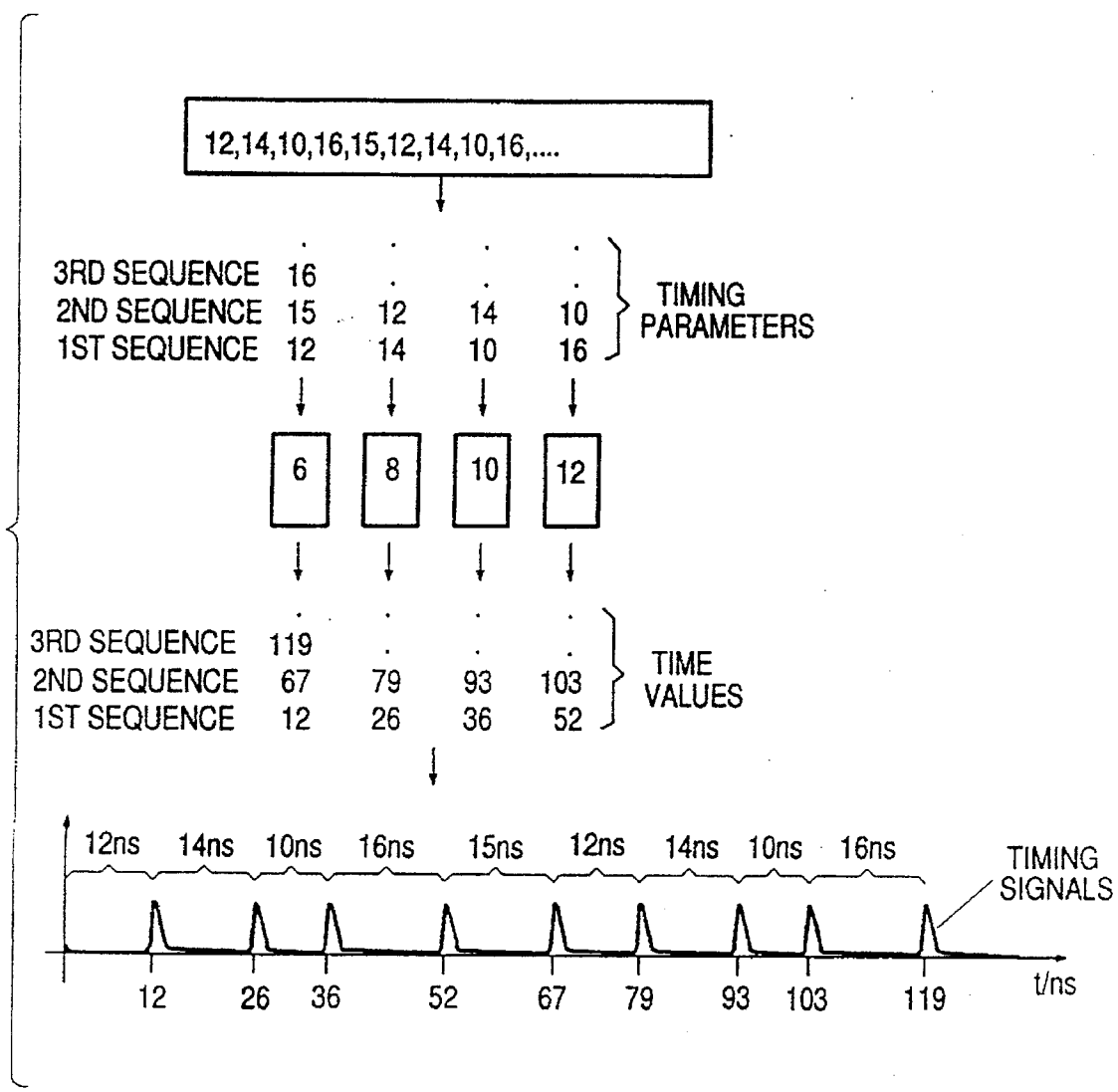
FIG. 1b shows the processing way from the series of timing parameters to the series of timing signals.

FIG. 1b shows the processing way from the series of timing parameters to the series of timing signals. At first, the series of timing parameters is split into successive sequences of successive timing parameters. In this example each sequence comprises 4 timing parameters. The first sequence then comprises the first four timing parameters of the series of timing parameters 12 ns, 14 ns, 10 ns and 16 ns. The second sequence comprises the second four timing parameters of the series of timing parameters 15 ns, 12 ns, 14 ns and 10 ns, and so on.

Each sequence will be processed in a next step which will be explained in FIG. 1c. After this processing each sequence now comprises the time values derived from the corresponding timing parameters. The first sequence then comprises the first four time values 12 ns, 26 ns, 36 ns and 52 ns, derived from the timing parameters of the first sequence of the series of timing parameters. The second sequence comprises the second four time values 67 ns, 79 ns, 93 ns and 103 ns, derived from the timing parameters of the second sequence of the series of timing parameters 15 ns, 12 ns, 14 ns and 10 ns, and so on.

Finally, the calculated time values are translated to physical signals and output as the series of timing signals.

Figure 1C:
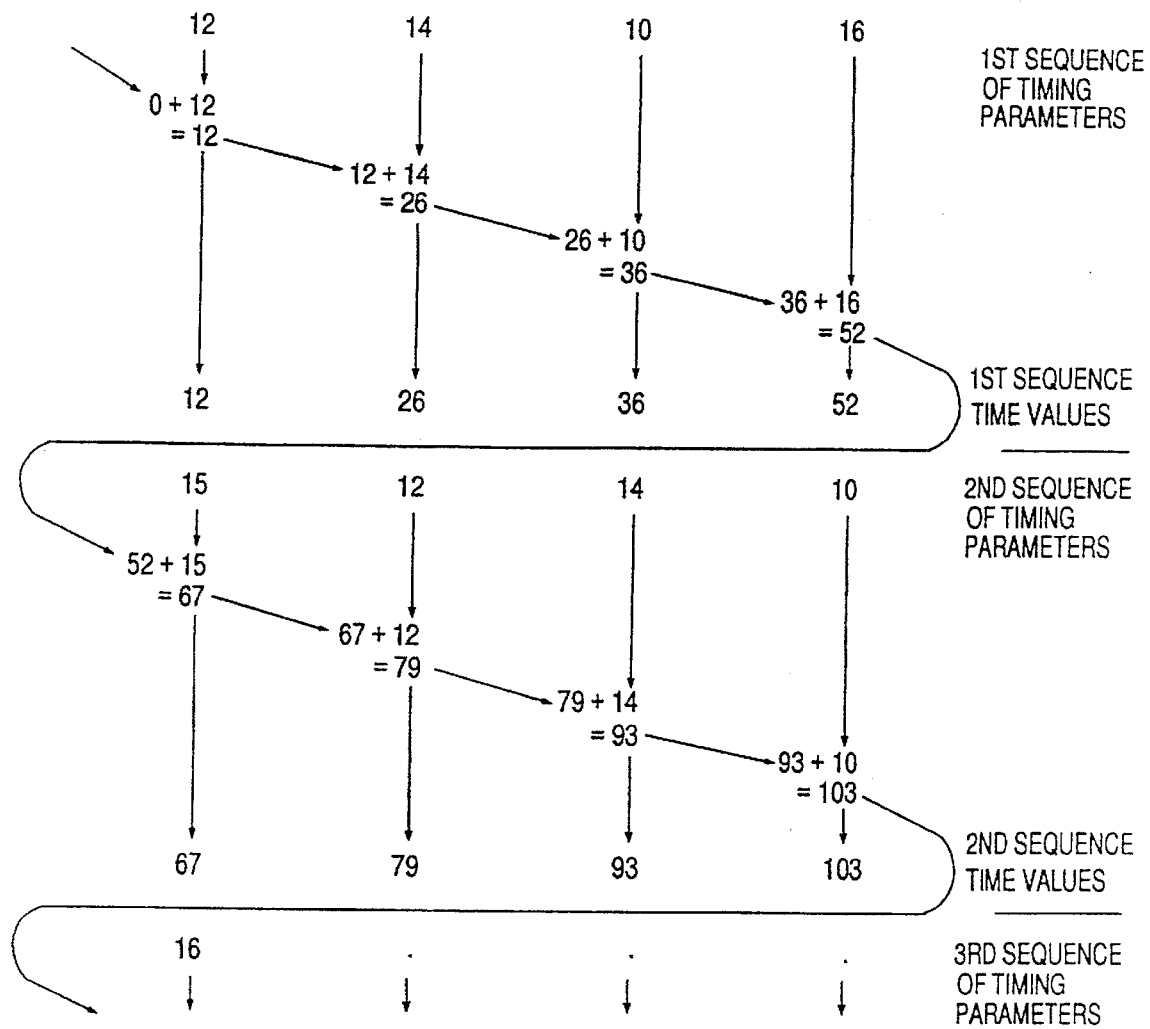
FIG. 1c explains the process of deriving the time values from the timing parameters according to one embodiment of the invention.

FIG. 1c explains the process of deriving the time values from the timing parameters according to one embodiment of the invention. In an initial state, the first sequence of timing parameters is processed first and each successive sequence will be processed following. Since the first timing parameter of the first sequence is the very first timing parameter of the series, the 12 ns are added to zero. The result is the first time value (12 ns) and is further added to the second timing parameter (14 ns) of the first sequence. The result is then the second time value (26 ns) and is further added to the third timing parameter (10 ns) of the first sequence. The result again is the third time value (36 ns) and is further added to the fourth timing parameter (16 ns) of the first sequence. The result is the fourth time value (52 ns) and completes the first sequence of time values.

Next, the timing parameters of the second sequence are applied. The fourth time value of the first sequence, the last time value of the preceding sequence, is added to the first timing parameter (15 ns) of the second sequence. The result is the first time value (67 ns) of the second sequence and is further added to the second timing parameter (12 ns) of the second sequence. The result is then the second time value (79 ns) of the second sequence and is further added to the third timing parameter (14 ns) of the second sequence. The result again is the third time value (93 ns) of the second sequence and is further added to the fourth timing parameter (10 ns) of the second sequence. The result is the fourth time value (103 ns) of the second sequence and completes the second sequence of time values. Each further sequence of timing parameters will then be processed accordingly.

Figure 1D:
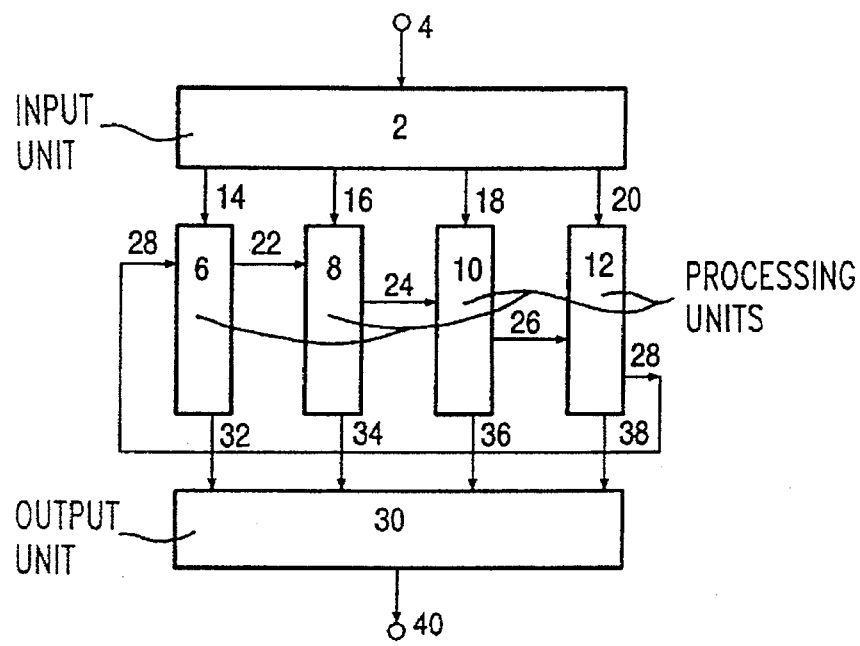
FIG. 1d shows the principal structure of an apparatus according to the invention.

FIG. 1d illustrates the principal structure of an apparatus according to the invention. Input unit 2 receives on input line 4 the series of timing parameters representing the series of timing signals. Connected to input unit 2 are four processing units 6, 8, 10 and 12, whereby processing unit 6 is connected via line 14 to input unit 2, processing unit 8 via line 16, processing unit 10 via line 18, and processing unit 12 via line 20. Each processing unit is coupled to the successive one: processing unit 6 is coupled to processing unit 8 via line 22, processing unit 8 is coupled to processing unit 10 via line 24, processing unit 10 is coupled to processing unit 12 via line 26, and processing unit 12 is coupled back to processing unit 6 via line 28. Each processing unit further is coupled to output unit 30: processing unit 6 via line 32, processing unit 8 via line 34, processing unit 10 via line 36, and processing unit 12 via line 38. Finally, output unit 30 outputs the series of timing signals on output line 40. It is to be understood that one processing unit is only needed for the processing of the timing signals. However, at least two processing units are needed to accomplish a parallel processing which allows an increased processing speed. The number of four processing units in the embodiments shown in the Figures is only examplary and not limiting.

The basic function of the embodiment in FIG. 1d can be illustrated in that the input unit 2 divides the series of timing parameters into successive sequences of successive timing parameters, whereby one sequence consists of minimum 1 and maximum 4 timing parameters in the example. It is to be understood that the maximum number of timing parameters per sequence in general is equal to the maximum number of available processing units.

The input unit 2 then distributes the sequences of the timing parameters simultaneously to a number of successive processing units equal to the number of timing parameters in one sequence. First processing unit 6 calculates a first time value from the first timing parameter of the one sequence and delivers the calculated first time value via line 32 to output unit 30 and via line 22 to successive processing unit 8. Processing unit 8 then calculates a second time value from the first calculated time value and the second timing parameter of the sequence, and delivers the second time value via line 34 to output unit 30 and via line 24 to successive processing unit 10.

In the case that the sequence consists of four timing parameters, third processing unit 10 calculates a third time value from the second time value and the third timing parameter of the sequence and delivers the third time value via line 36 to output unit 30 and via line 26 to successive processing unit 12. Proccessing unit 12 as the one to process the last timing parameter in the sequence calculates a fourth time value from the third time value and the fourth, and therefore last, timing parameter in the sequence. The calculated fourth time value is then applied via line 38 to output unit 30 and also fed back via line 28 to first processing unit 6.

The successive sequence will be calculated hereafter accordingly. However, processing unit 6 as the one to process the first timing parameter of each sequence will calculate the respective time value from the respective first timing parameter of each sequence applied on line 14 and the calculated time value of the last timing parameter of the preceding timing parameter applied on line 28.

In the case that a sequence consists of less timing parameters than available processing units, the last calculated time value of each sequence will be fed through the successive processing unit(s) or directly to first processing unit 6 without changing the value of the last calculated time value. It is to be understood that the number of timing parameters in one sequence is variable by input unit 2 in order to optimize the processing of all timing parameters. Since the repetition rate of each processing unit requires a certain time to calculate and process the time values, a parallel arrangement of n processing units can reduce the repetition rate of the entire apparatus to 1/n-th of the repetition rate of one single processing unit.

Still referring to FIG. 1d, the calculated time values are applied via lines 32, 34, 36 and 38 to output unit 30. Output unit 30 eventually outputs the series of timing signals from the calculated time values.

Figure 2A:
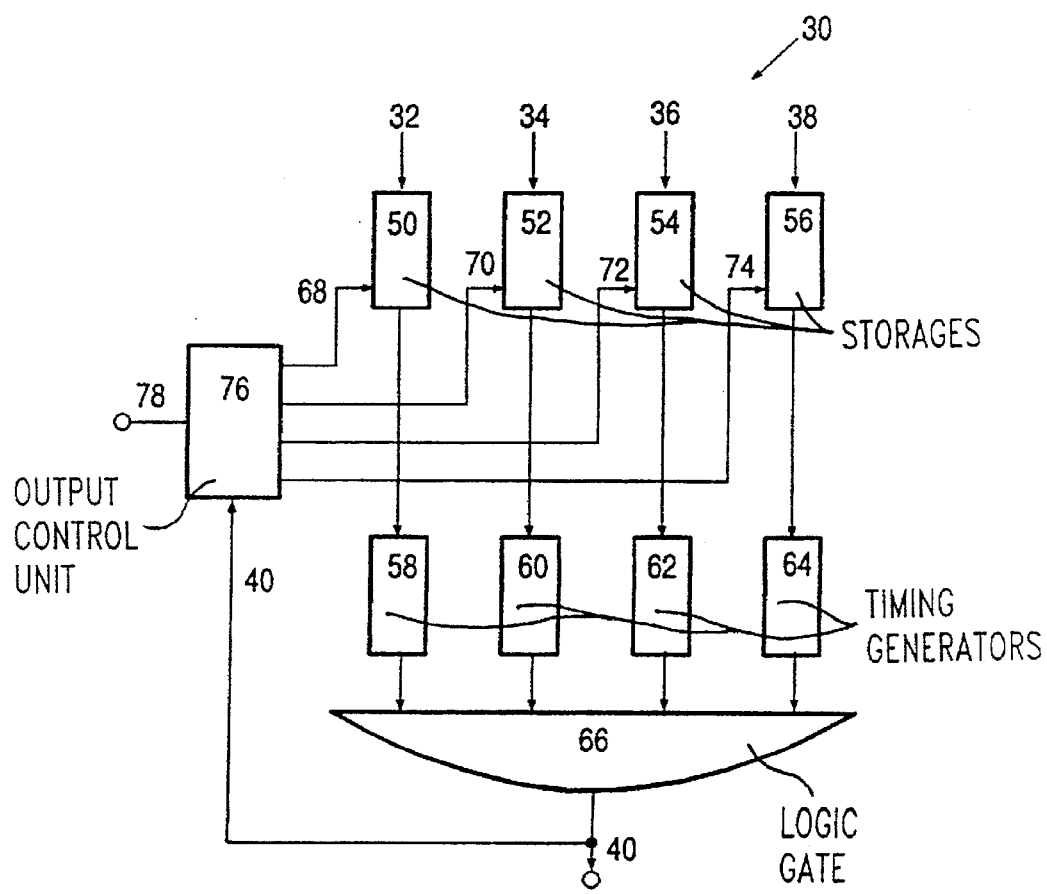
FIG. 2a shows an embodiment of the output unit 30.

FIG. 2a shows an embodiment of output unit 30. Lines 32, 34, 36 and 38 of the respective processing units 6, 8, 10 and 12 are each connected to respective storage 50, 52, 54 and 56. The storages are preferably first-in-first-out (FIFO) storages, meaning that the time values stored first will be accessible first. Each storage 50, 52, 54 and 56 is separately connected to respective timing generator 58, 60, 62 and 64 and each timing generator 58, 60, 62 and 64 is coupled to logic gate 66, which preferably is an OR gate. Each one of storages 50, 52, 54 and 56 can be controlled via respective control line 68, 70, 72 and 74 by an output control unit 76.

The function of output unit 30 in FIG. 2a is that the calculated time values of each sequence are storable in the respective FIFO storages 50, 52, 54 and 56, in a way that the calculated time values of one sequence are simultaneously accessible in output unit 30. Via respective control lines 68, 70, 72 and 74, output control unit 76 enables respective storages 50–56, so that the time values of one sequence are simultaneously applied to respective timing generators 58, 60, 62 and 64. Timing generators 58, 60, 62 and 64 then simultaneously generate timing signals from the time values. The generated timing signals are applied to logic gate 66, and subsequently output on line 40 as a total timing signal.

Output control unit 76 is controlled by a reference signal on line 78 and a feedback signal from line 40. The reference signal on line 78 starts the output process, and storages 50–56, comprising the time values of one sequence, are triggered simulataneously. The last timing signal generated by timing generators 58–64, which corresponds to the last time value of a sequence, again triggers storages 50–56 comprising the time values of the next sequence. By this explanation it is clear that the time values of each sequence have to be calculated according to the calculation of the time values of the first sequence, as shown in FIG. 1c, only. A further reference to the last time value of the preceding sequence (as shown in FIG. 1c for the second sequence) is not necessary due to the triggering of each sequence by the last timing signal of the preceding sequence. In a further embodiment, the reference signal is implemented as a reference clock signal and the output of the timing signals is also refered to the reference clock.

Figure 2B:
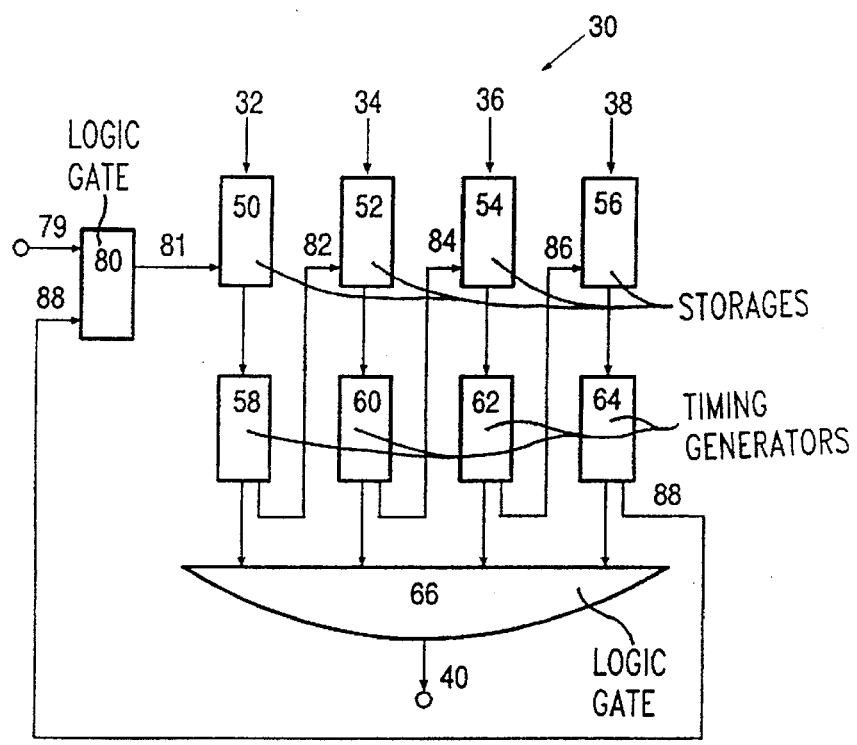
FIG. 2b shows another embodiment of the output unit 30.

FIG. 2b shows another embodiment of output unit 30. Storage 50 is triggerable by an initial trigger signal on line 79 through logic gate 80 connected via line 81 to storage 50. When timing generator 58 has generated a timing signal, successive storage 52 will be triggered via line 82. Similarly, timing generator 60 triggers successive storage 54 via line 84 and timing generator 62 triggers successive storage 56 via line 86. Last timing generator 64 again triggers first storage 50 via line 88 connected to a second input of logic gate 80. The time values in this embodiment represent the time intervals between successive timing signals. In case of the example of FIG. 1b, the timing parameters already represent the time intervals between successive timing signals so that no further calculation is necessary.

Figure 2C:
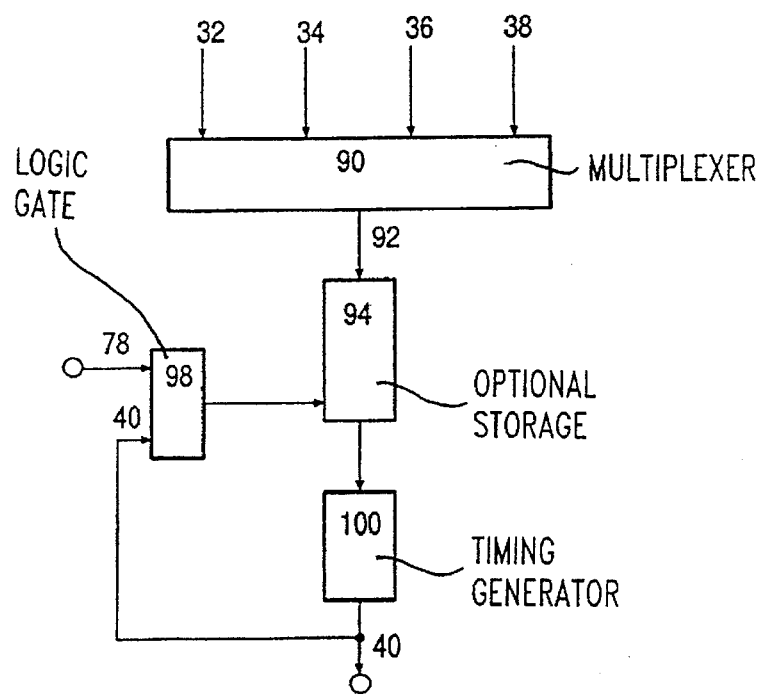
FIG. 2c shows a further embodiment of the output unit 30.

FIG. 2c shows a further embodiment of output unit 30. Lines 32, 34, 36 and 38 are coupled to multiplexer 90 which distributes the calculated time values through line 92 to optional storage 94. Storage 94 is triggerable by an initial trigger signal on line 78 connected to storage 94 through logic gate 98. Storage 94 is coupled to timing generator 100 and the generated timing signals are output on line 40 and fed back to storage 94 through logic gate 98. The time values in this embodiment represent the time intervals between successive timing signals as in FIG. 2b. One sequence basically comprises n timing parameters when n processing units are available. In another embodiment, storage 94 is implemented as a triggerable shift register whereby at least one register place is necessary. The embodiments of FIG. 2c allow high performance although not requiring costly components. That means that only components 90, 94 and 100 need to be high speed or higher speed components while all other components can be low cost and slower components.

Figure 3A:
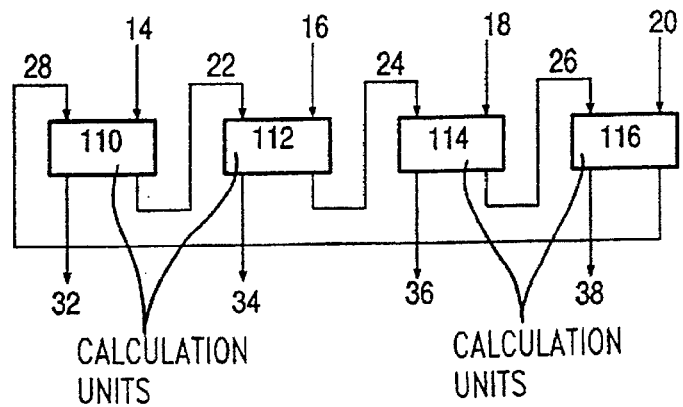
FIG. 3a shows an embodiment of the processing units.

FIG. 3a shows an embodiment of processing units 6–12. Processing unit 6 comprises calculation unit 110 having lines 14 and 28 as an input and lines 22 and 32 as an output. Processing unit 8 comprises calculation unit 112 having lines 16 and 22 as an input and lines 24 and 34 as an output. Processing unit 10 comprises calculation unit 114 having lines 18 and 24 as an input and lines 26 and 36 as an output.

Processing unit 12 comprises a calculation unit 116 having lines 20 and 26 as an input and lines 28 and 38 as an output.

Within one sequence, calculation unit 110 calculates a first time value from the first timing parameter of the sequence on input line 14 and the last time value of the preceding sequence on input line 28. The calculated first time value is set on output lines 22 and 32. Accordingly, calculation units 112, 114 and 116 calculate, dependent on the number of timing parameters in the sequence, a second, third and fourth time value from the respective timing parameter and the calculated preceding time value. However, in many applications the time delay due to the time demand for the calculation causes problems in this embodiment.

Figure 3B:
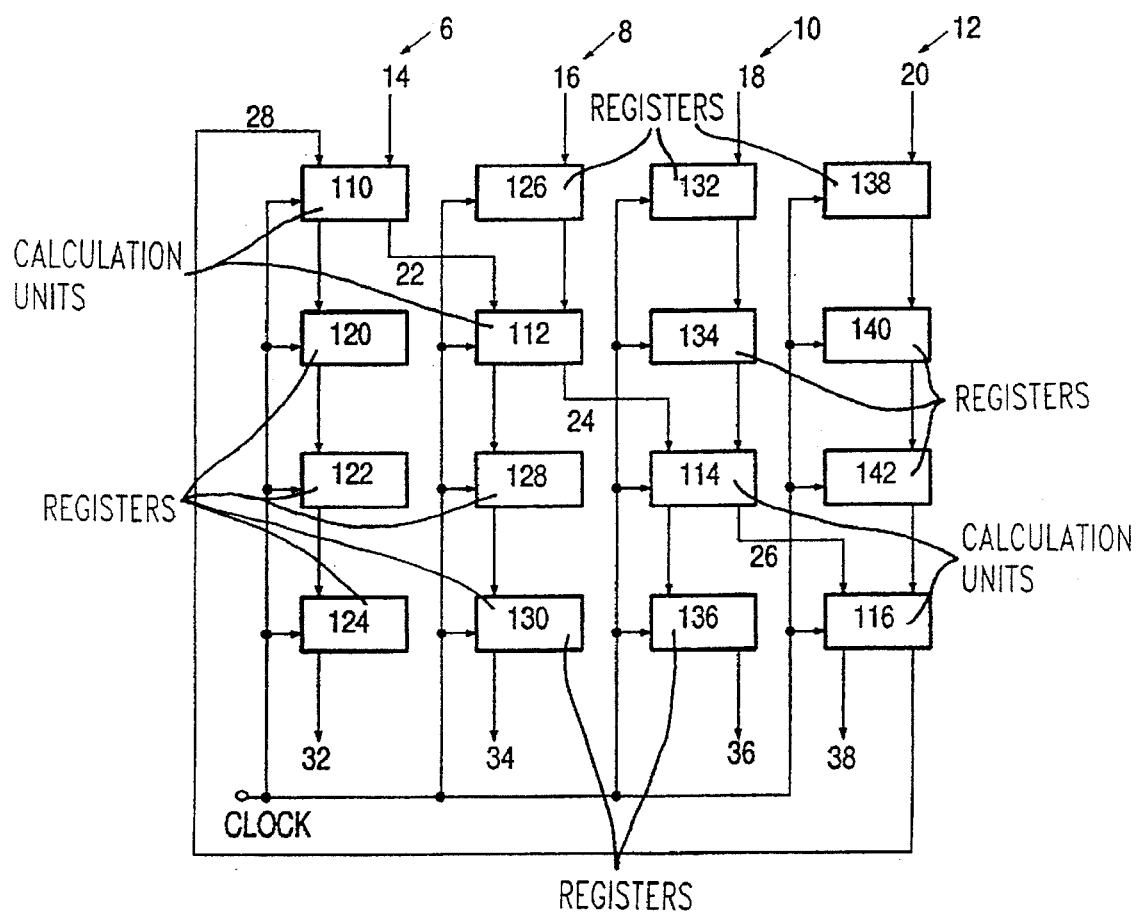
FIG. 3b shows an improved embodiment of the processing units.

FIG. 3b shows an improved embodiment of processing units 6–12 in order to eliminate the influence of the time delay caused by calculating in the calculation units. Each of processing units 6–12 consists of one calculation unit and three registers in order to set a defined start and end time for the calculation. In processing unit 6, lines 14 and 28 are connected to calculation unit 110, and calculation unit 110 is coupled via line 22 to calculation unit 112 of processing unit 8. Calculation unit 112 is coupled via line 24 to calculation unit 114 of processing unit 10. Calculation unit 114 is coupled via line 26 to calculation unit 116 of processing unit 12 and calculation unit 116 again is coupled via line 28 back to calculation unit 110.

Calculation unit 110 further is coupled through a series connection of registers 120, 122 and 124 to line 32. In processing unit 8, line 16 is coupled through register 126 to calculation unit 112 and then through a series connection of registers 128 and 130 to line 34. In processing unit 10, line 18 is coupled through a series connection of two registers 132 and 134 to calculation unit 114 and then through register 136 to line 36. In processing unit 12, line 20 is coupled through a series connection of three registers 138, 140 and 142 to calculation unit 116 and then to line 38. Furthermore, each calculation unit and each register is connected to and contollable by a CLOCK signal. The CLOCK signal and the reference signal can be either the same, preferably derived from each other or even completely independent. If n processing units are available, each processing unit will comprise one calculation unit and n–1 registers. It is clear from the symmetry of FIG. 3b, that the order of the registers and the calculation unit in one processing unit depends on the order and arrangement of the preceeding processing units. The first processing unit comprises a series connection of the calculation unit and n–1 registers. The 2nd processing unit comprises a series connection of the one register, the calculation unit and n–2 registers. The 3rd processing unit comprises a series connection of the two register, the calculation unit and n–3 register, and so on.

The function of the processing units according to FIG. 3b can be described as following. The timing parameters of a first sequence are applied on lines 14 to 20 with a first CLOCK signal. A first time value is calculated in calculation unit 110 and set on its output lines, whereas the other timing parameters are respectively registered in registers 126, 132 and 138. When the second CLOCK signal appears, the timing parameters of registers 132 and 138 are shifted to registers 134 and 140, the calculated first time value is shifted into register 120, and the timing parameter of register 126 is applied to calculation unit 112 to calculate a second time value from the first time value and the second timing parameter of register 126.

When the third CLOCK signal appears, the first time value is shifted to register 122, the second time value into register 128, the third time value is calculated in calculation unit 114 from the second time value on line 24 and the third timing parameter of the first sequence from register 134, and the fourth timing parameter of the first sequence is shifted from register 140 to 142. Accordingly when the fourth CLOCK signal appears, the first time value is shifted to register 124, the second time value into register 130, the third time value into register 136, and the calculation unit 116 calculates a fourth time value from the third time value on line 26 and the fourth timing parameter of the first sequence of register 142.

When the fifth CLOCK cycle appears, the calculated time values of the first sequence are shifted onto lines 32 to 38 to output unit 30. Simultaneously, the timing parameters of a second sequence are applied on lines 14 to 20 and processed according to the processing during the first to fourth CLOCK signals. The only difference is that calculation unit 110 now calculates the first time value of the second sequence from the first timing parameter of the second sequences on line 14 and the last calculated time value of the first sequence supplied on line 28.

Figure 3C:
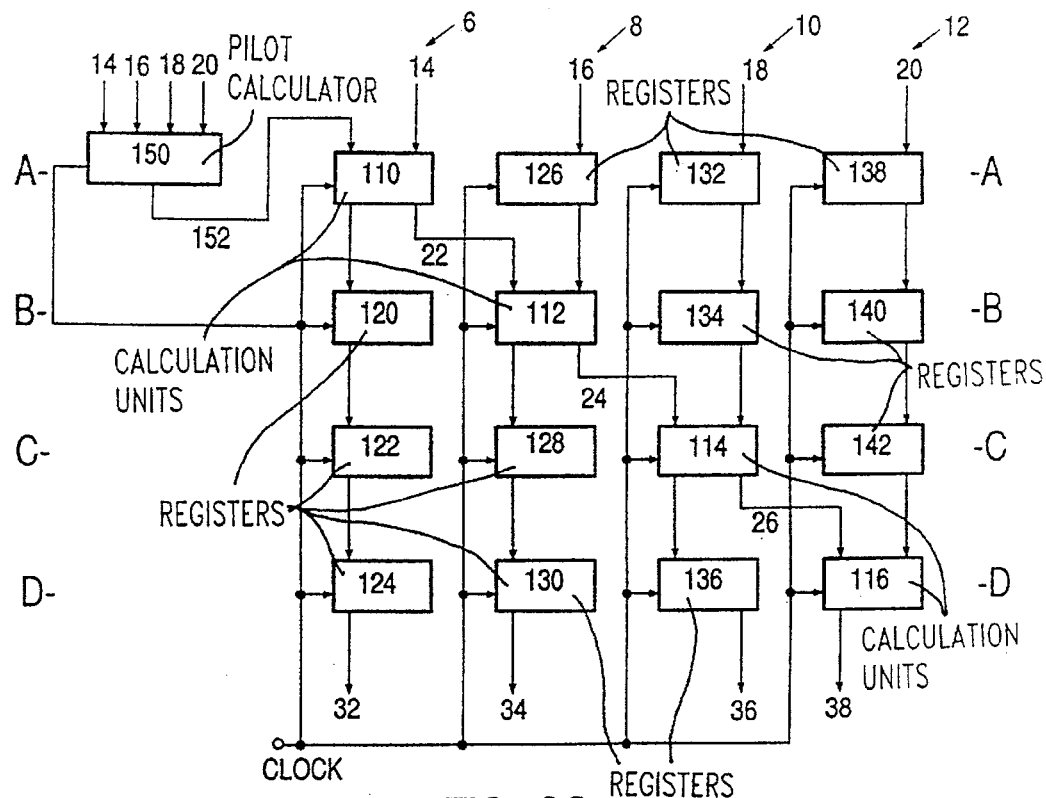
FIG. 3c shows a further improved embodiment of the processing units according to FIG. 3b.

FIG. 3c shows a further improved embodiment of the processing units 6–12 according to FIG. 3b. The circuit of FIG. 3c comprises, instead of feedback line 28, pilot calculator 150 connected via line 152 to calculation unit 110. Pilot calculator 150 further comprises connections to lines 14 to 20 and to the CLOCK signal, and calculates the last time value of the preceding sequence before the successive sequence is processed.

By the arrangement of FIG. 3c, it is possible to apply a new sequence of timing parameters on lines 14 to 20 with every new CLOCK signal, thus increasing the processing speed of the entire arrangement. The embodiment according to FIG. 3c, comprising pilot calculator 150, allows for optimizing and maximizing processing speed since the processing of each sequence of timing parameters will be independent of the processing of the preceding sequence. The function of the circuit of FIG. 3c is explained as follows.

An initial first sequence of timing parameters is applied by a first CLOCK signal on lines 14 to 20. Calculation unit 110 calculates a first time value of the first sequence from the first timing parameter of the first sequence and the other timing parameters are read into registers 126, 132 and 138. Pilot calculator 150 already provides the last time value of the first sequence. In the case shown in FIG. 1c, pilot calculator 150 adds up all timing parameters of the first sequence. This can be implemented either by an n-stage adder or by the same arrangement of processing units as above.

When the second CLOCK signals appears, the first time value of the first sequence is shifted to register 120, calculation unit 112 calculates the second time value of the first sequence, and the third and fourth timing parameters from registers 132 and 138 are shifted into registers 134 and 140. Simultaneously, the timing parameters of the second sequence are applied on lines 14 to 20 and calculation unit 110 calculates a first time value of the second sequence from the first timing parameter of the second sequence and the last time value of the first sequence supplied by pilot calculator 150 via line 152. The other timing parameters of the second sequence are read into registers 126, 132 and 138. Pilot calculator 150 now already provides the last time value of the second sequence.

When the third CLOCK signals appears, the circuit behaves as at the second CLOCK signal. The first time value of the first sequence is shifted to register 122, the second time value of the first sequence is shifted to register 128, calculation unit 114 calculates the third time value of the first sequence, and the fourth timing parameter is shifted from register 140 into register 142, The first time value of the second sequence is shifted to register 120, calculation unit 112 calculates the second time value of the second sequence, and the third and fourth timing parameters of the second sequence are respectively shifted from registers 132 and 138 into registers 134 and 140.

Simultaneously, the timing parameters of the third sequence are applied on lines 14 to 20 and calculation unit 110 calculates a first time value of the third sequence from the first timing parameter of the third sequence and the last time value of the second sequence supplied by pilot calculator 150. The other timing parameters of the third sequence are read into registers 126, 132 and 138. Pilot calculator 150 now calculates the last time value of the third sequence. When the following CLOCK signals appear, the processing of the timing parameters in the processing units behave accordingly, and the time values of each sequence are applied after 4 CLOCK signals on lines 32–38 respectively.

In general the function of the circuit in FIG. 3c is as follows: each new CLOCK signal clocks a new sequence of timing parameters on lines 14 to 20 into the elements of horizontal line AA. The timing parameters or the corresponding time values of the sequence preceding the sequence in AA are located in the elements of horizontal line BB, the timing parameters or the corresponding time values of the sequence preceding to the sequence in BB are located in the elements of horizontal line CC, and accordingly, the timing parameters or the corresponding time values of the sequence preceding the sequence in CC are accordingly located in the elements of horizontal line DD.

When the fifth CLOCK signal appears, the calculated time values of the first sequence are simultaneously shifted into output unit 30 and each following CLOCK signal clocks the time values of the successive sequence into output unit 30. In the case of n available processing units, the respective calculated time values will be applied to output unit 30 when the n+1th CLOCK signal appears. It is clear that the registers between respective calculation unit and output unit 30 are only optional and the circuits can be built up without. However, it has to be secured that the calculated time values of one sequence are thereafter simultaneously accessable in or for output unit 30.

The processing units shown in FIG. 3c exhibit more sophisticated characteristics with respect to the processing units of FIGS. 3a and 3b, since they provide the fastest processing of the timing parameters. The processing units according to FIG. 3c further provide the possibility of building up completely modular processing units, as is apparent from FIG. 3d.

Figure 3D:
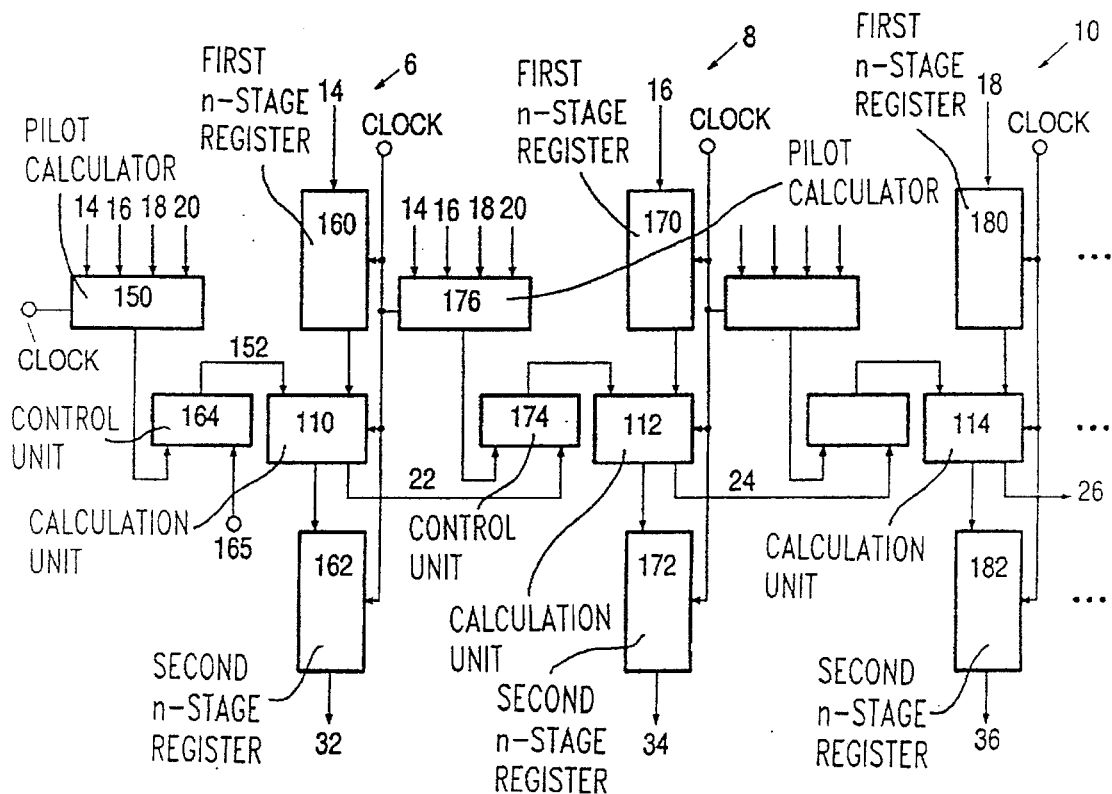
FIG. 3d shows a further improved embodiment of the processing units with modular structure.

FIG. 3d shows a further improved embodiment of the processing units in a modular structure. Each processing unit 6–10 comprises a series connection of a first controllable n-stage register, a calculation unit and a second controllable n-stage register, each one connected to the CLOCK signal. Processing unit 6 contains controllable n-stage register 160 connected between line 14 and calculation unit 110, and another contollable n-stage register 162 connected between calculation unit 110 and line 32. Calculation unit 110 is further connected according FIG. 3c, whereby control unit 164 is connected between pilot calculator 150 and calculation unit 110. Control unit 164 comprises second input line 165 to which an output line of the preceding calculation unit can be connected.

Processing unit 8 of FIG. 3d is similar to processing unit 6, comprising controllable n-stage registers 170 and 172, and control unit 174 connected between pilot calculator 176 and calculation unit 112. Pilot calculator 176 has connections to lines 14 to 20 and to the CLOCK signal, and calculates between two CLOCK signals the last time value of the preceding sequence. Control unit 174 further comprises an additional connection to line 22 from processing unit 6. Other processing units 10 and 12 are similar to processing unit 8, and each calculation unit is connected via a respective control unit to the preceding calculation unit. The controllable n-stage registers and the control units are each connected and controllable by input unit 2 (FIG. 10). Each calculation unit comprises a pilot calculator whereby the respective control unit controls weather the calculation unit calculates the time value from the preceding time value or from the pilot value of the pilot calculator, by either selecting the line from the preceding calculation unit or the pilot calculator as the input for the calculation unit.

When input unit 2 divides the series of timing parameters into sequences of successive timing parameters it further supplies signals to the controllable n-stage registers and the control units according to the number of timing parameters in one sequence. In the case that only one timing parameter forms a sequence, input unit 2 enables only processing unit 6 to work when the CLOCK signal appears. Controllable n-stage register 160 immediately transfers the timing parameter to calculation unit 110 and at the successive CLOCK signal the calculated time value is immediately transfered through controllable n-stage register 162 to line 32.

In the case that the sequence consists of two timing parameters, input unit 2 enables processing unit 6 and 8 to work when the CLOCK signal appears. The first timing parameter of this sequence is transfered immediately to calculation unit 110 and a first time value is calculated from the first timing parameter and the preceding time value supplied by pilot calculator 150, while the second timing parameter is registered in the controllable n-stage register 170 until the next CLOCK signal. Then, the second time value is calculated in calculation unit 112 from the second timing parameter and the first time value, and the calculated first time value is registered into controllable n-stage register 162. The next CLOCK clocks the first time value of the sequence from register 162 to line 32, and the second time value through the controllable n-stage register 172 to the line 34.

When the sequence contains three timing parameters, input unit 2 enables processing unit 6, 8 and 10 to work when the CLOCK signal appears. At the first CLOCK signal, the first time value is calculated in calculation unit 110 while the second and the third timing parameters are registered respectively in controllable n-stage registers 170 and 180. At the next CLOCK signal, the first time value is registered in controllable n-stage register 162, the second time value is calculated in calculation unit 112, while the third timing parameter is still registered in controllable n-stage register 180. At the following CLOCK signal, the first time value is still registered in controllable n-stage register 162, the second time value is registered in controllable n-stage register 172, and the third time value is calculated in calculation unit 114. The successive CLOCK signal simultaneously clocks the calculated time values of the sequence to respective lines 32, 34 or 36.

As apparent from above explanation, the time for registering the timing parameters or time values in the controllable n-stage registers is dependent on the position of the processing units and the number of timing parameters in the sequence. It will be appreciated by those familiar with the art, that the modular characteristics of FIG. 3d even renders possible the processing of several sequences of timing parameters in parallel. Thus it is possible to minimize the number of components while optimizing the load on the apparatus. The controlling of the respective components by input unit 2 is well known in the art and does not need to be discussed herein. Furthermore, multiple parallel output units are applicable in that case, also controllable by the input unit 2. As well as in the circuit of FIG. 3c, a new sequence of timing parameters is clockable onto the respective input lines with each new CLOCK cycle, whereby the numbers of timing parameters in each sequence can differ.

An example of the calculation process within processing units 110–116, according to the embodiments of FIGS. 3a, 3b, 3c and 3d, can be seen in FIG. 1c. In the embodiments of FIG. 3a and 3b, the last value (52 ns) of the first sequence is available after four CLOCK signals. In the embodiments of FIG. 3c and 3d, the last value (52 ns) of the first sequence is already available after one CLOCK signal by the pilot calculator 150, so that a new sequence can be processed with every new CLOCK signal. In the case that output unit 30, according to FIG. 2a, is used, the time values of each sequence have to be calculated according to the calculation of the time values of the first sequence, as shown in FIG. 1c, only. A further reference to the last time value of the preceding sequence (as shown in FIG. 1c for the second sequence) is then not necessary due to the triggering of each sequence by the last timing signal of the preceding sequence. This allows the application of a new sequence with every new CLOCK signal for all the embodiments of FIGS. 3a, 3b and 3c.

For several applications it is advantageous to split up the timing parameters into fine parameters and coarse parameters in order to refer the output of the timing signals to an oscillator signal. This allows a high precision output of the timing signals since each timing signal is derived from the oscillator cycle. The coarse parameters then represent times greater than or equal to the oscillator period time of the CLOCK signal and the fine parameters represent times smaller than the oscillator period time. For example, if the oscillator period time is 10 ns, and the timing parameter is 18 ns, the coarse time parameter will be 10 ns (or one oscillator period) and the fine timing parameter will be 8 ns. If the timing parameter is 8 ns, the coarse time parameter will be zero and the fine timing parameter will be 8 ns. If the timing parameter is 115 ns, the coarse time parameter will be 110 ns (or 11 oscillator periods) and the fine timing parameter will be 5 ns. If the timing parameter is 50 ns, the coarse time parameter will be 50 ns (or 5 oscillator periods) and the fine timing parameter will be zero.

Figure 4A:
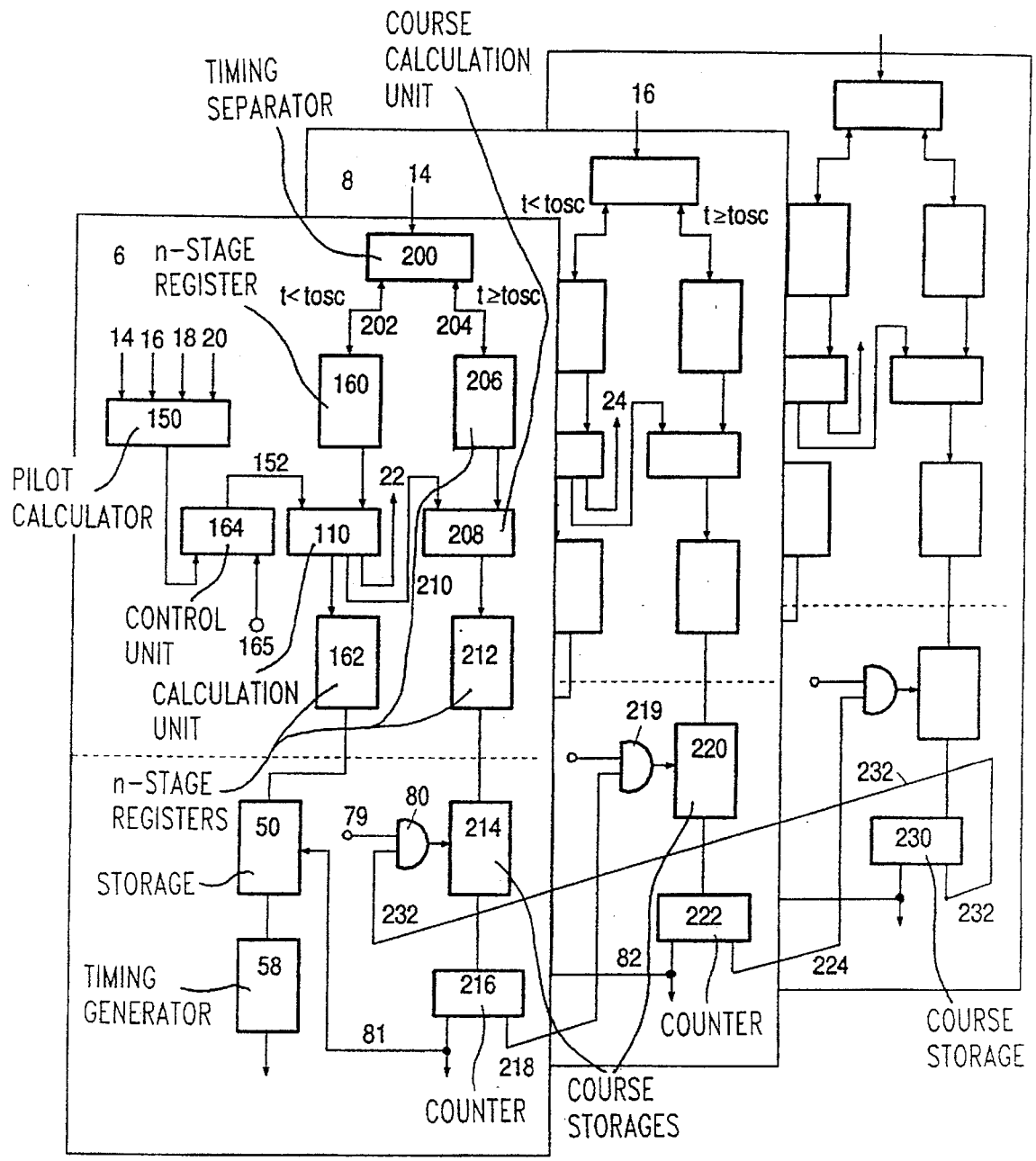
FIG. 4a shows an embodiment for parallel processing of timing parameters split up into fine parameters and coarse parameters based on the embodiment according to FIG. 3d.

FIG. 4a shows an embodiment for parallel processing of timing parameters split up into fine parameters and coarse parameters based on the embodiments of FIGS. 3d and 2b.

In processing unit 6 of FIG. 4a, line 14 from input unit 2 is connected to timing separator 200 for splitting up the timing parameters delivered on line 14 into fine parameters on line 202 and coarse parameters on line 204. Line 202 is connected to controllable n-stage register 160. Elements 160, 110, 150, 164 and 162 are connected as shown in FIG. 3d. Line 204 is connected through controllable n-stage register 206 to coarse calculation unit 208, and coarse calculation unit 208 is further connected via line 210 to calculation unit 110 and to another controllable n-stage register 212. Controllable n-stage registers 206 and 212 and coarse calculation unit 208 comprise further connections to the CLOCK signal (not shown).

The fine parameters are processed and calculated as described hereinabove in the description of FIGS. 3d. However, the calculation in calculation unit 110 results in a fine time value which is smaller than the oscillator period time and a carry which is equal to the oscillator period time of the CLOCK signal or multiples of it. For example if the oscillator period time is 10 ns, and the calculation results in a time value of 18 ns, the fine time value will be 8 ns and the carry will be 10 ns (or one oscillator period).

The carry is delivered via line 210 to coarse calculation unit 208. Clearly, the coarse calculation in coarse calculation unit 208 can first be excecuted when the respective carry has been calculated by calculation unit 110, and the coarse parameter needs to be registered in controllable n-stage register 206 accordingly.

From the coarse parameter and the calculated carry on line 210, coarse calculation unit 208 calculates a coarse time value representing zero or multiples of the oscillator period time, which will be registered in controllable n-stage register 212, and thereafter, stored in coarse storage 214 connected to controllable n-stage register 212. Coarse storage 214, as a FIFO storage, is triggerable by logic gate 80 with a first input connected to line 79. The signal applied on line 79 can either be an initial trigger signal for starting the timing signal generation, or a signal applied from input unit 2, for example, in order to separate the units for simultaneously processing of multiple sequences.

When logic gate 80 triggers coarse storage 214, the stored coarse time value is passed to counter 216 for counting down a coarse time represented by the coarse time value. When the coarse time is ellapsed, counter 216 simultaneously triggers storage 50 (via line 81), which contains the corresponding fine time value, and logic gate 219 (via line 218) to successive coarse storage 220 which is connected to successive processing unit 8. It is pointed out that each processing unit with its respective output unit is built up according to the above description for processing unit 6.

When the coarse time in counter 216 is ellapsed and storage 50 is triggered, the stored fine time value in storage 50 is delivered to timing generator 58 for generating the respective timing signal from the fine time value. Simultaneously, successive coarse storage 220 delivers the stored successive coarse time value to counter 222 for counting down the successive coarse time represented by the successive coarse time value. When this coarse time is ellapsed, counter 222 triggers storage 52 (not shown) via line 82 and next coarse storage 230 via line 224. Storage 52 contains the corresponding fine time value.

As is apparent from FIG. 4a, each counter simultaneously trigggers the storage containing the corresponding fine time value and the successive coarse storage containing the successive coarse time value. However, the last counter, e.g. counter 230, triggers, via line 232 connected to the second input of logic gate 80, coarse storage 214, the storage connected to first processing unit 6.

Figure 4B:
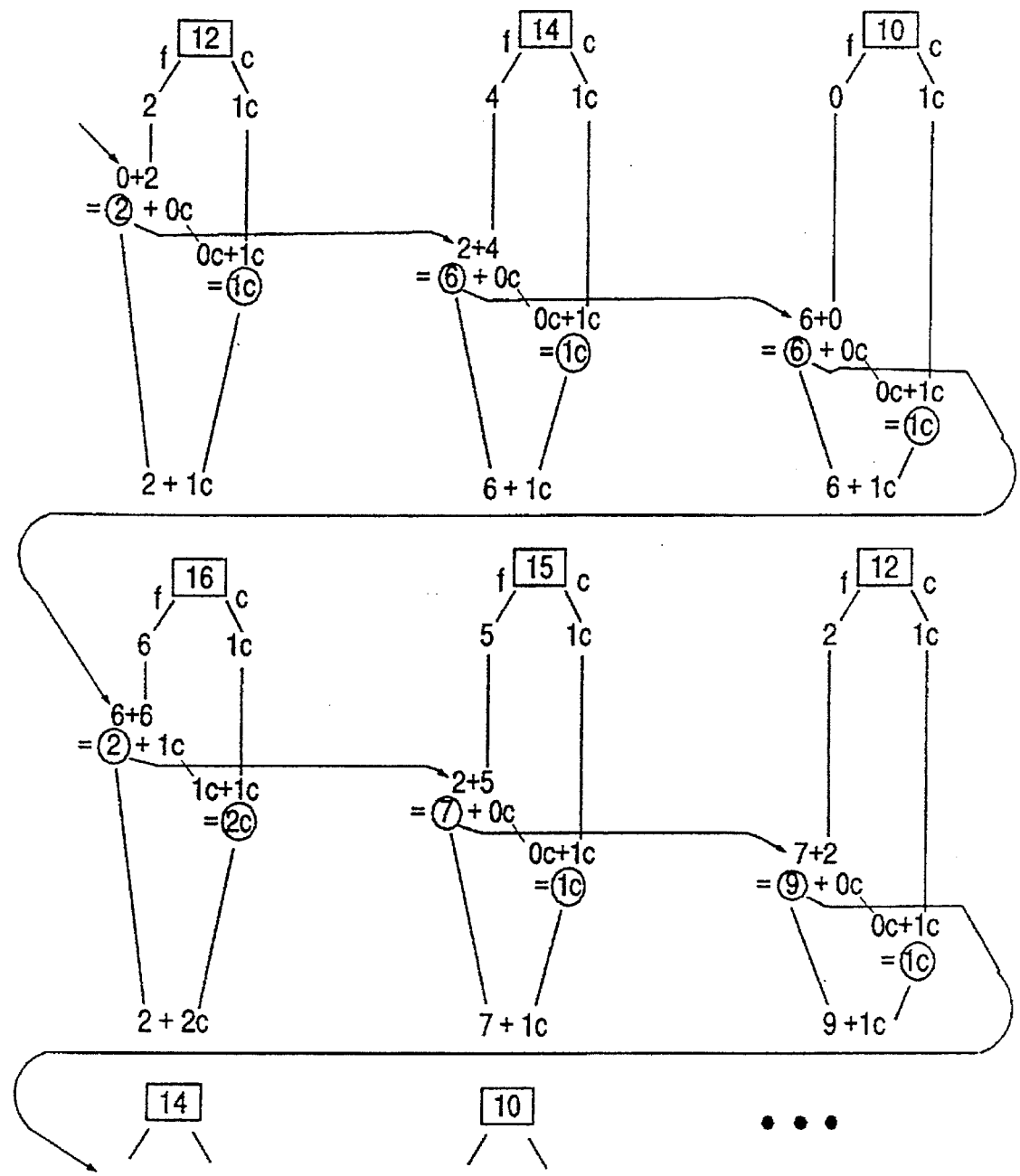

FIG. 4b shows an example of the calculation process according to the embodiment of FIG. 4a. For the sake of clarity, the values of the timing parameters used in this example are the same as the values of the timing parameters used in the example of FIG. 1c. In the example of FIG. 4b, the oscillator period time is 10 ns=1c and each sequence comprises 3 timing parameters. For better understanding, the units of the coarse parameters and the coarse time values are referred to as multiples of the oscillator period time c, e.g.: 50 ns=5c.

At first, the timing parameters are split up into fine parameters and coarse parameters. The first timing parameter (12 ns) of the sequence is split up into the first fine parameter (2 ns) and the first coarse parameter (1c), the second timing parameter (14 ns) of the sequence is split up into the second fine parameter (4 ns) and the second coarse parameter (1c), and so on. Since the first fine parameter is the first one to be processed, a zero is added to the first fine parameter (2 ns), resulting in the first fine time value (2 ns) and a zero carry (0c) of the first fine time value. The first coarse parameter (1c) is added to the zero carry (0c) of the first fine time value, resulting in the first coarse time value (1c).

Simultaneous with the calculation of the first coarse time value, the first fine time value (2 ns) is added to the second fine parameter (4 ns) of the first sequence, resulting in the second fine time value (6 ns) and again in a zero carry (0c) of the second fine time value. The second coarse parameter (1c) is added to the zero carry (0c) of the second fine time value resulting in the second coarse time value (1c).

Again simultaneous with the calculation of the second coarse time value, the second fine time value (6 ns) is added to the third fine parameter (0 ns) of the first sequence, resulting in the third fine time value (6 ns) and again in a zero carry (0c) of the third fine time value. The third coarse parameter (1c) is added to the zero carry (0c) of the third fine time value resulting in the third coarse time value (1c).

The second sequence is applied and also split up into fine and coarse parameters. Simultaneous with the calculation of the third coarse time value of the first sequence, the third fine time value (6 ns) of the first sequence is added to the first fine parameter (6 ns) of the second sequence, resulting in the first fine time value (2 ns) and now in a carry (1c) of the first fine time value. The first coarse parameter (1c) of the second sequence is added to the carry (1c) of the first fine time value, resulting in the first coarse time value (2c) of the second sequence. It is to be understood that the application of the third fine time value of the first sequence to the first fine parameter of the second sequence can either be accomplished by means of the pilot calculator 150 or by feeding back to the input line 165 of the control unit 164.

Simultaneous with the calculation of the first coarse time value of the second sequence, the first fine time value (2 ns) of the second sequence is added to the second fine parameter (5 ns) of the second sequence, resulting in the second fine time value (7 ns) and in a zero carry (0c) of the second fine time value. The second coarse parameter (1c) of the second sequence is added to the zero carry (0c) of the second fine time value, resulting in the second coarse time value (1c) of the second sequence.

The calcultion of the fine and coarse time values of each successive timing parameter will be accomplished accordingly.

Figure 4C:
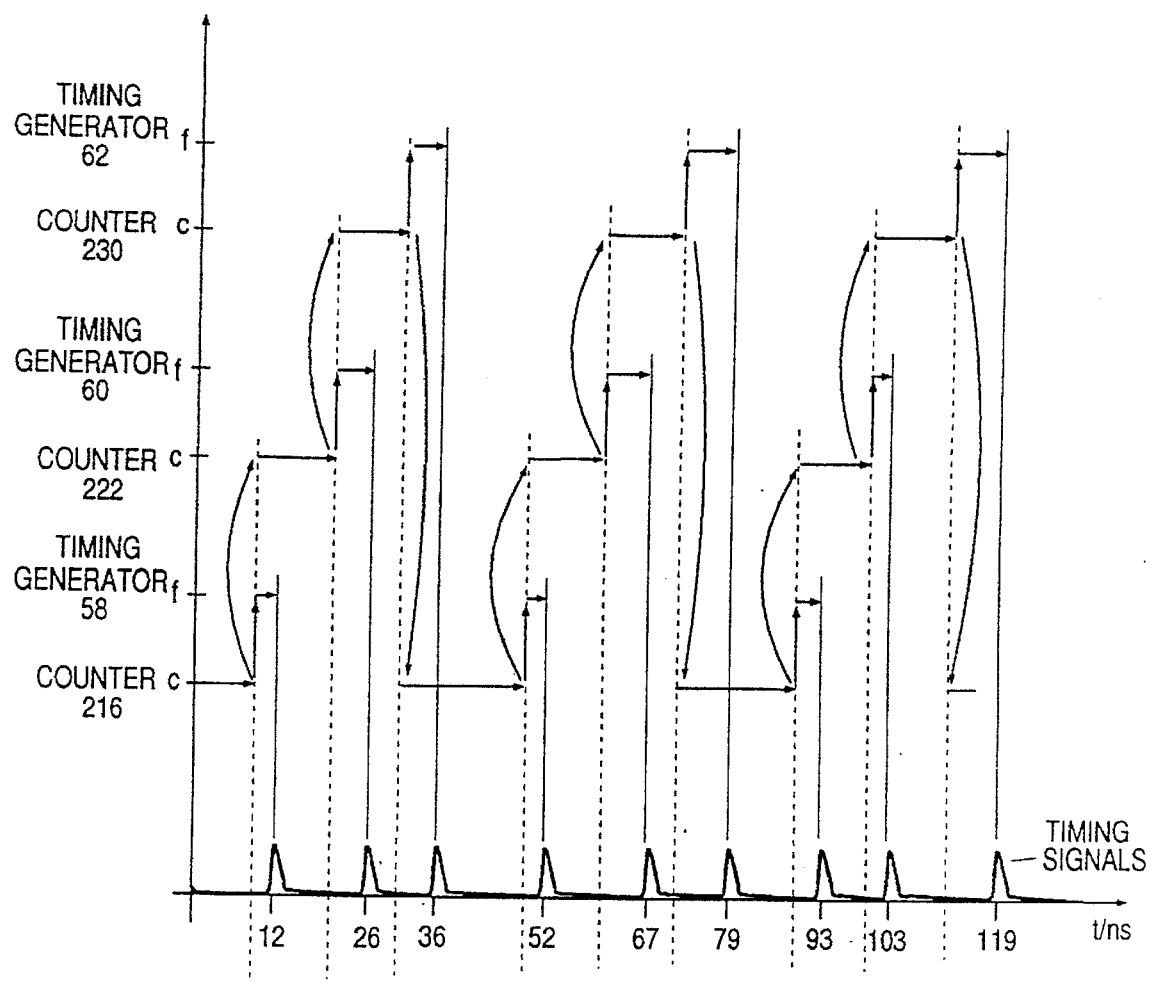
FIG. 4c shows in a combined process and signal flow chart the outputting of the fine and coarse time values calculated according FIG. 4b.

FIG. 4c shows in a combined process and signal flow chart the outputting of the fine and coarse time values calculated according to FIG. 4b. An initial signal starts the outputting and triggers coarse storage 214, delivering the first coarse time value (1c) of the first sequence to counter 216. After the first coarse time value (1c) of the first sequence representing one clock period is ellapsed, counter 216 simultaneously triggers fine storage 50, containing the first fine time value (2 ns) of the first sequence, and the successive coarse storage, containing the second coarse time value (1c) of the first sequence. Timing generator 58 generates the first timing signal when the first fine time (2 ns) is ellapsed.

When the second coarse time value (1c) of the first sequence, again representing one clock period, is ellapsed, counter 222 simultaneously triggers corresponding fine storage 52, containing the second fine time value (6 ns) of the first sequence, and the successive coarse storage, containing the third coarse time value (1c) of the first sequence. Timing generator 60 generates the second timing signal when the second fine time (6 ns) is ellapsed.

When the third coarse time value (1c) of the first sequence is ellapsed, counter 230 simultaneously triggers corresponding fine storage 54, containing the third fine time value (6 ns) of the first sequence, and the successive coarse storage 214, containing the first coarse time value (2c) of the second sequence. The timing generator 62 generates the third timing signal when the third fine time (6 ns) is ellapsed. The further ouputting of the timing signals can be seen in FIG. 4c.

To understand the modularity of the circuits in FIG. 4a, it is pointed out that each coarse storage is controllable by the respective logic gate 80, 219. Each logic gate 80, 219 comprises at least two input lines, one connected to the preceding counter and one connected to input unit 2. Thus, the respective coarse storage can either be triggered by the preceding counter or by a signal applied from input unit 2 in order to process multiple sequences of timing parameters simultaneously. It is clear that the number of processing units in FIG. 4a is not limitted and each processing unit is built up completely modularly.

Figure 5:
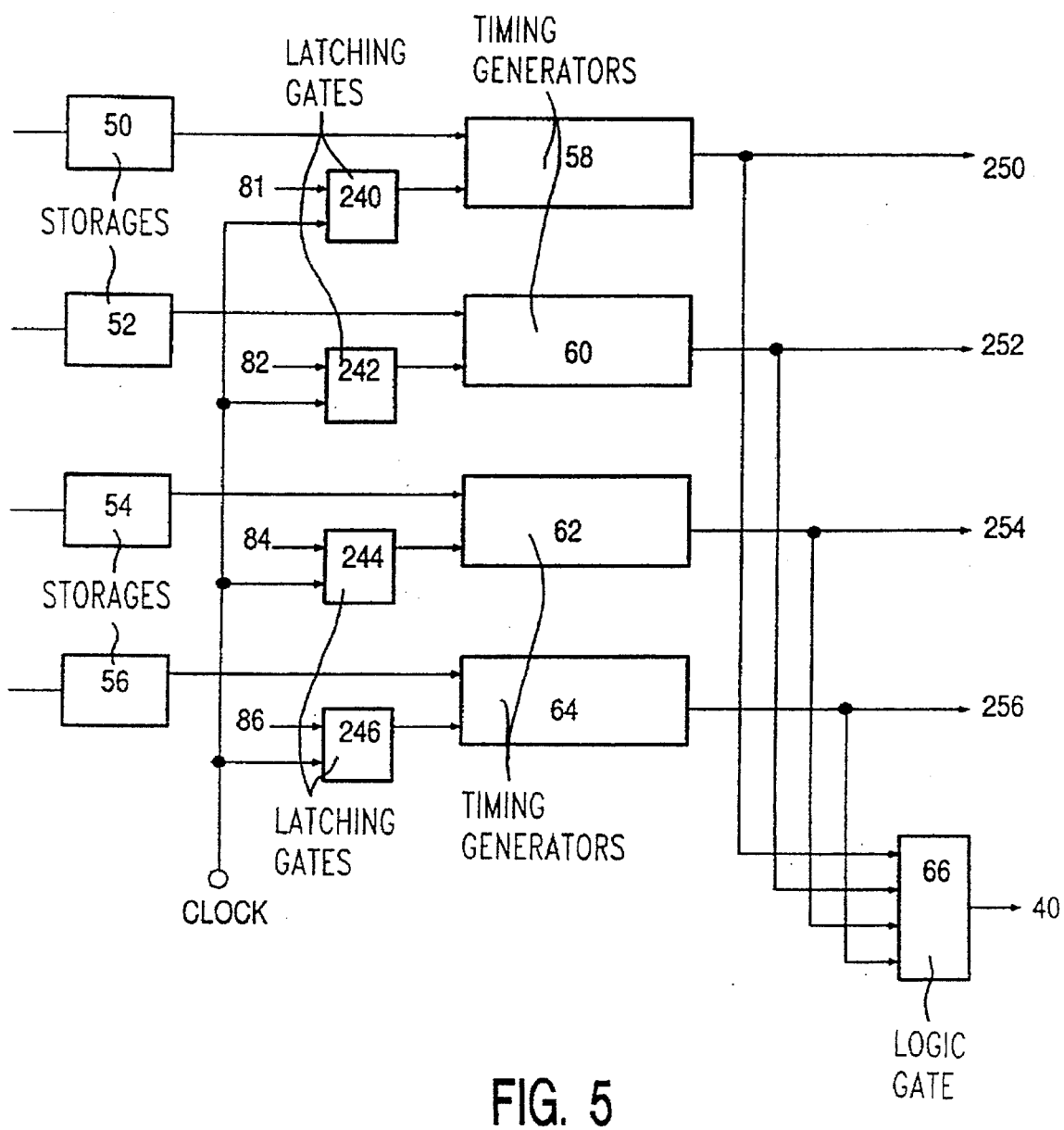

FIG. 5 shows further improved output unit 30 according to the embodiment of FIG. 4a. Line 81 (and, accordingly, lines 82, 84 and 86) has a connection through latching gate 240 (242, 244 and 246) to respective timing generator 58 (60, 62 and 64) for triggering timing generator 58 (60, 62 and 64). Latching gate 240 (242, 244 and 246) is also connected to the CLOCK signal and preferably is a so called D-Flip-Flop comprising data input 81 and clock input CLOCK. When data input line 81 is enabled by counter 216 and also a specific CLOCK edge appears at the clock input of latching gate 240, latching gate 240 triggers timing generator 58 to generate the corresponding timing signal at output line 250. Accordingly, lines 82, 84 and 86 enable the respective latching gates 52, 54, and 56, thus triggering respective timing generators 60, 62, and 64, generating the respective timing signals at output line 252, 254 or 256. Output lines 250–256 can either be used selectively or fed into logic gate 66, which preferably is an OR gate, to combine them to a total output signal on line 40. It is to be understood that the circuitry to combine output lines 250–256 is only exemplary and depends on the objects of the timing signals. However, such circuitry is well known in the art and needs not be discussed here.

The circuit of FIG. 5 makes possible a strict separation between circuits requiring high precission components and lower precission components. The former are only required for the generation of the timing signals, e.g. the timing generators 58–64. The accuracy of the generated timing signals is mainly determined by these high precission components so that they are preferably implemented in ECL or GaAs technology. The latter components are not necessarily high speed and accuracy components and can be accomplished preferably in low cost CMOS technology. Latching gates 240–246 allow this separation because their signal output is directly refered to the CLOCK signal, thus adopting the CLOCK accuracy.

Timing generators 58–94 in the above embodiments are preferably controllable delay lines. However, any other timing generation technology can be used for the invention. It will be appreciated by those familiar with the art that the separation into coarse and fine parameter processing allows the use of highly accurate delay lines for the fine time generation which only needs to cover the oscillator period time.

Calculation units 110–116 in the above embodiments are preferably adders for adding the respective timing parameters with the time value representing the preceding timing parameter. However, any other calculation unit can be used for the invention, and different calculation algorithms can be used, such as calculating the time difference between the timing signals. It will be appreciated by those familiar with the art, that the principels of the invention are not limited to the calculation algorithms introduced above.

The modularity of the embodiments of FIGS. 3d to 5 allows a simultaneous processing of multiple sequences of timing parameters. The required controlling for this parallel processing of multiple sequences is controllable for example by input unit 2, and is well known in the art.

Pilot calculators 150, 176 simply fulfill the task of providing the results of the preceding sequence to the calculation unit which calculates the first timing parameter of the successive sequence. Since the results of the processing units and the pilot calculators must be the same but available at a different time, the pilot calculators 150, 176 are preferably similar to processing units 110–116, thus reducing the number of different components. The modularity of the embodiments of FIGS. 3d to 5 even allows providing a modular processing unit, e.g. processing unit 8, and to combine multiples of those modular processing units as well for parallel processing units 6–12 as for respective pilot calculators 150, 176. In practice, one or more modular processing units are on a chip module and the interconnections can be chosen depending on the specific application. The time delay of the pilot calculator 150, 176 causes a constant time offset which has to be taken into account by controlling input unit 2.

Furthermore, it is understood that only one processing unit is necessary to process the series of timing signals according to the invention. High processing speed is achievable by combining a plurality of parallel processing units in order to provide parallel processing of the timing signals. However, in many applications parallel processing is not necessary or only necessary sometimes. The above discussed modularity allows the use of modular processing units, whereby the number of processing units can be selected depending on the required processing speed.

What is claimed is:

1. Apparatus for processing a series of timing parameters representing series of timing signals comprising:

an input unit for inputting the series of timing parameters representing the series of timing signals;

n processing units, including a first processing unit and a successive processing unit for processing and calculating time values from the series of timing parameters;

an output unit for outputting a series of timing signals from said time values;

wherein said input unit comprises means to divide the series of timing parameters into sequences of timing parameters, the first sequence having n timing parameters, said input unit further comprising means to distribute the n timing parameters of a sequence to said n processing units for parallel processing of the n timing parameters; and wherein said first processing unit comprises means to calculate a first time value from a first one of the timing parameters of each sequence and said successive processing unit comprises means to calculate a successive time value from a successive one of the timing parameters and from said first time value.

2. The apparatus as recited in claim 1 wherein said output unit further comprises:

a first storage means coupled to said first processing unit for storing said first time value calculated in said first processing unit;

a successive storage means coupled to said successive processing unit for storing said succesive time value calculated in said successive processing unit;

a first timing generator coupled to said first storage means for generating a first timing signal from said first stored time value;

a successive timing generator coupled to said successive storage means for generating a successive timing signal from said successive stored time value; and said successive timing generator being triggerable by one of said first timing generator generating said first timing signal and by a trigger signal simultaneously applied to said first and said successive timing generators.

3. The apparatus as recited in claim 1 wherein said output unit is clockable by an oscillator timing signal having an oscillator period time.

4. The apparatus as recited in claim 3 wherein said first and said successive storage means are clockable by said oscillator timing signal whereby said first and said successive timing generators simultaneously generate said first and said successive timing signals from said first and said successive stored time values.

5. The apparatus as recited in claim 3 wherein said means to calculate said first time value is a first calculation unit and said means to calculate said successive time value is a successive calculation unit, said successive calculation unit coupled to said first calculation unit to receive said first time value from said first calculation unit.

6. The apparatus as recited in claim 5 further comprising a successive register means coupled to said successive calculation unit, wherein said successive register means registers the successive one of the timing parameters unless said first time value is available.

7. The apparatus as recited in claim 5, including a last processing unit for processing and calculating a last time value of said first sequence, said last processing unit comprising a last calculation unit, the apparatus further comprising a pilot calculator coupled to said first processing unit for providing said last time value of said first sequence to said first calculation unit to calculate a next time value from said last time value of said first sequence and from a first timing parameter of a second sequence.

8. The apparatus as recited in claim 3 further comprising:

a separation means for separating said series of parameters into fine parameters and coarse parameters, whereby said coarse parameters represent times greater than or equal to said oscillator period time and said fine parameters represent times smaller than said oscillator period time;

wherein said second processing unit comprises a fine calculation unit for calculating fine time values from said fine parameters, a coarse calculation unit for calculating coarse time values from said coarse parameters, first register means coupling to said fine calculation unit for registering a second fine parameter unless a calculated fine time value of said first timing parameter is available, and second register means coupling to said coarse calculation unit for registering a second coarse parameter unless a corresponding calculated fine time value is available;

said storage means comprising coarse storage means for storing said coarse time values and fine storage means for storing said fine time values;

said timing generators comprising coarse timing generators for generating coarse timing signals stored in the coarse storage means and corresponding fine timing generators for generating fine timing signals stored in the fine storage means; and a first coarse timing generator of said first processing unit being clockable and said corresponding fine timing generator and a successive coarse timing generator of said successive processing unit being triggerable by said first coarse timing generator.

9. The apparatus as recited in claim 8, wherein said coarse timing generators are counters.

10. A method for processing timing parameters representing a series of timing signals comprising the steps of;

a) inputting the timing parameters representing the series of timing signals;

b) distributing a first sequence of n successive timing parameters to n interconnected processing units for parallel processing in said n processing units, said processing units comprising a first processing unit connected to receive a first timing parameter and a successive processing unit connected to receive a succesive timing parameter;

c) calculating n time values from said n timing parameters in said n processing units, whereby said first processing unit calculates a first time value from said first timing parameter and said succesive processing unit calculates a successive time value from the successive timing parameter and from said first time value; and d) outputting the series of timing signals.

11. The method as recited in claim 10 further comprising a step subsequent to said step (c) of storing the respective calculated time value of each processing unit;

wherein said step (d) comprises the step of generating timing signals from the stored time values by means of timing generators, and wherein the calculated time values of said first sequence of timing parameters are simultaneously accessible.

12. The method as recited in claim 11 wherein said step of generating timing signals from said stored time values comprises a step of triggering a successive timing generator of said successive processor unit by a timing generator of said first processor unit generating a first timing signal.

13. The method as recited in claim 11 wherein said step of generating timing signals is a step of simultaneously generating timing signals from said stored time values of one sequence subsequent to the step of clocking said output unit.

14. The method as recited in claim 10 further comprising prior to said step (c) the step of registering the successive timing parameter unless the time value corresponding to the first timing parameter is available.

15. The method as recited in claim 10 further comprising a step of clocking said output unit with an oscillator having a period time.

16. The method as recited in claim 15 further comprising the steps of:

prior to said step (c) a step of separating said timing parameters into fine parameters and coarse parameters, wherein said coarse parameters represent times greater than or equal to said oscillator period time and said fine parameters represent times smaller than said oscillator period time;

subsequent to said step (c) a step of storing coarse time values calculated from said coarse parameters and storing fine time values calculated from said fine parameters of said respective timing parameter; and wherein said step (d) comprises the step of generating coarse timing signals from said stored coarse time values and generating fine timing signals from said stored fine time values.

17. The method as recited in claim 16 wherein said step (d) comprises the step of clocking a first one of said stored coarse time values and triggering the corresponding fine time value and the succesive coarse time value after said first one of said coarse time values has been generated.

18. The method as recited in claim 10 further comprising the steps of:

providing to said first processing unit a last time value from a last processing unit connected to recieve a last timing parameter of said first sequence; and calculating a next time value from said last time value and from a first timing parameter of a second sequence.

\* \* \* \* \*